US007522022B2

(12) United States Patent
Yamada

(10) Patent No.: US 7,522,022 B2
(45) Date of Patent: Apr. 21, 2009

(54) PLANAR FILTER, SEMICONDUCTOR DEVICE AND RADIO UNIT

(75) Inventor: Atsushi Yamada, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 623 days.

(21) Appl. No.: 10/535,948

(22) PCT Filed: Nov. 18, 2003

(86) PCT No.: PCT/JP03/14617

§ 371 (c)(1),
(2), (4) Date: May 24, 2005

(87) PCT Pub. No.: WO2004/049495

PCT Pub. Date: Jun. 10, 2004

(65) Prior Publication Data

US 2006/0164188 A1 Jul. 27, 2006

(30) Foreign Application Priority Data

Nov. 25, 2002 (JP) ........................... P2002-340506
Oct. 20, 2003 (JP) ........................... P2003-359073

(51) Int. Cl.
*H03H 7/00* (2006.01)
*H01P 3/08* (2006.01)

(52) U.S. Cl. ....................... 333/204; 333/185; 333/219; 333/246

(58) Field of Classification Search ................. 333/203, 333/204, 205, 185, 219, 246
See application file for complete search history.

(56) References Cited

U.S. PATENT DOCUMENTS

2001/0054943 A1 12/2001 Takeda

FOREIGN PATENT DOCUMENTS

JP 2-106701 U 8/1990
JP 4-225601 A 8/1992
JP 2002-76703 A 3/2002

OTHER PUBLICATIONS

"Basics and Applications of Microwave Circuits" by Yoshihiro Konishi, pp. 369-373, published by Sogo Denshi Publishing, Aug. 20, 1990.

*Primary Examiner*—Robert Pascal
*Assistant Examiner*—Kimberly E Glenn
(74) *Attorney, Agent, or Firm*—Birch, Stewart, Kolasch & Birch, LLP

(57) ABSTRACT

A planar filter has first and second U-shaped open transmission line resonators (103, 105) and a crank-shaped open transmission line resonator (104), so that it is possible to decrease an area to be virtually occupied by the filter on a dielectric substrate (110) and enhance the attenuation characteristic.

8 Claims, 8 Drawing Sheets

PLANAR FILTER, SEMICONDUCTOR DEVICE AND RADIO UNIT

This application is the US national phase of International Application PCT/JP2003/014617 filed Nov. 18, 2003, which designated the US. PCT/JP2003/014617 claims priority to JP Patent Application No. 2002-340506 filed Nov. 25, 2002 and JP Patent Application No. 2003-359073 filed Oct. 20, 2003. The entire contents of these applications are incorporated therein by reference.

BACKGROUND OF THE INVENTION

The present invention relates to a planar filter suitable for use, for example, in microwave bands including millimeter wave bands, and more particularly to a planar filter preferable for use in high-frequency radio communication devices such as millimeter wave communication devices using a frequency of 30 GHz or more, as well as to a semiconductor device and a radio unit having the planar filter.

Conventionally, there have been planar filters that use microstrip resonators. A design method thereof is described in, e.g., a literature "Basics and Applications of Microwave Circuits" by Yoshihiro Konishi, pages 369-373, published by Sogo Denshi Publishing, Aug. 20, 1990).

FIGS. 6A and 6B show one example of conventional planar filters. FIG. 6A is a plan view and FIG. 6B is a cross sectional view taken along the line D-D' in FIG. 6A. The planar filter is structured such that an input line 1, an output line 2, a resonator 3, a resonator 4 and a resonator 5 are formed on a dielectric substrate 10 having a grounding conductor 11 on the back face. Each of the resonator 3, the resonator 4 and the resonator 5 has a line length that is half an equivalent wavelength of a passband center frequency.

As shown in FIG. 6A, a part of the input line 1 and a part of the resonator 3 are in parallel proximity to each other with a constant gap therebetween to thereby establish electromagnetic coupling. Also, a part of the resonator 3 and a part of the resonator 4 are in parallel proximity to each other with a constant gap therebetween so as to achieve electromagnetic coupling. In a similar manner, the resonator 4 and the resonator 5, as well as the resonator 5 and the output line 2 are in parallel proximity to each other with a constant gap therebetween for electromagnetic coupling, respectively. By appropriately disposing the resonators 3 to 5 and the input/output transmission lines 1, 2 to optimize the degree of coupling, a desired bandwidth can be achieved. The shown planar filter has thee resonators 3, 4, and 5. It is to be noted that while a larger number of resonators can increase attenuation outside the band, it also increases loss in the pass band and the area to be occupied by the filter.

The shape and arrangement of the resonators in the conventional planar filter shown in FIG. 6 has following problems. If the resonators are arrayed in a longitudinal direction, the size of the planar filter is increased. Particularly in the case where the planar filter is integrated on an IC chip for reducing a loss in a connection section between the planar filter and other high-frequency integrated circuits, the conventional resonator layout deteriorates space efficiency of the IC chip and increases dead space not available for other circuits, with the result that the size of the IC chip and the unit cost of the chip are increased.

SUMMARY OF THE INVENTION

In consideration of these drawbacks, an object of the present invention is to provide a planar filter occupying a small area, suitable for integration on an IC chip, and having good wave filtration characteristics and good attenuation characteristics.

In order to accomplish the object, a planar filter according to the present invention has a first U-shaped open transmission line resonator, a second U-shaped open transmission line resonator, and a crank-shaped open transmission line resonator.

In this invention, the provision of the first and second U-shaped open transmission line resonators and the crank-shaped open transmission line resonator makes it possible to decrease the area to be virtually occupied by the filter on a dielectric and enhance the attenuation characteristic. This allows a device having the planar filter to be downsized.

In one embodiment, the first and second U-shaped open transmission line resonators and the crank-shaped open transmission line resonator have a line length that is half an equivalent wavelength of a passband center frequency component. This allows the planar filter to have an enhanced filtration characteristic.

In one embodiment, the first and second U-shaped open transmission line resonators and the crank-shaped open transmission line resonator are arranged so as to be electromagnetically coupled in an order of the first U-shaped open transmission line resonator, the crank-shaped open transmission line resonator, and the second U-shaped open transmission line resonator. The planar filter further comprises a first input/output transmission line and a second input/output transmission line, and the first input/output transmission line is arranged so as to be electromagnetically coupled to the first U-shaped open transmission line resonator, and the second input/output transmission line is arranged so as to be electromagnetically coupled to the second U-shaped open transmission line resonator.

In this embodiment, due to the shapes and arrangement, or layout, of the first and second U-shaped open transmission line resonators and the crank-shaped open transmission line resonator, it is possible to decrease the area to be virtually occupied by the filter on a dielectric. This allows downsizing of a device having the planar filter.

In one embodiment, the first and second input/output transmission lines and the crank-shaped open transmission line resonator are arranged such that a part of at least one of the first and second input/output transmission lines and a part of the crank-shaped open transmission line resonator are electromagnetically coupled to each other.

In this embodiment, part of the first and/or second input/output transmission line serving as an input transmission line or an output transmission line bypasses the first and second U-shaped open transmission line resonators and establishes direct electromagnetic coupling with the crank-shaped open transmission line resonator. Consequently, in addition to a first transmission route on which a signal is transmitted in the order of the first input/output transmission line (input line), the first U-shaped open transmission line resonator, the crank-shaped open transmission line resonator, the second U-shaped open transmission line resonator and the second input/output transmission line (output line), there is formed a second transmission route on which a signal is transmitted in the order of the first input/output transmission line (input line), the crank-shaped open transmission line resonator, and the second input/output transmission line (output line).

Therefore, appropriate adjustment of a phase difference between the first and the second transmission routes allows mutual cancellation of signals at frequencies in the close vicinity of the passband. This allows the attenuation characteristic outside the passband to be steep.

In one embodiment, the first and second U-shaped open transmission line resonators and the crank-shaped open transmission line resonator are formed on a semiconductor substrate. This embodiment facilitates fabrication of a semiconductor device having a small-sized, high-performance planar filter.

A semiconductor device according to an embodiment has the above-described planar filter, which is integrated with a mixer on a semiconductor substrate. In this embodiment, the planar filter is formed on a semiconductor substrate in the integrated manner with the mixer, so that power loss in a connection section between the mixer and the planar filter can be minimized, which in turn allows a more compact semiconductor device with higher performance to be realized.

Further, a radio unit in one embodiment has the planar filter. Since the radio unit in the embodiment has the planar filter, it becomes possible to realize a radio communication device and a radio relay device as a compact and high-performance radio unit.

DETAILED DESCRIPTION OF THE INVENTION

Hereinbelow, the present invention will be described in conjunction with the embodiments with reference to the drawings.

First Embodiment

Figure 1A:
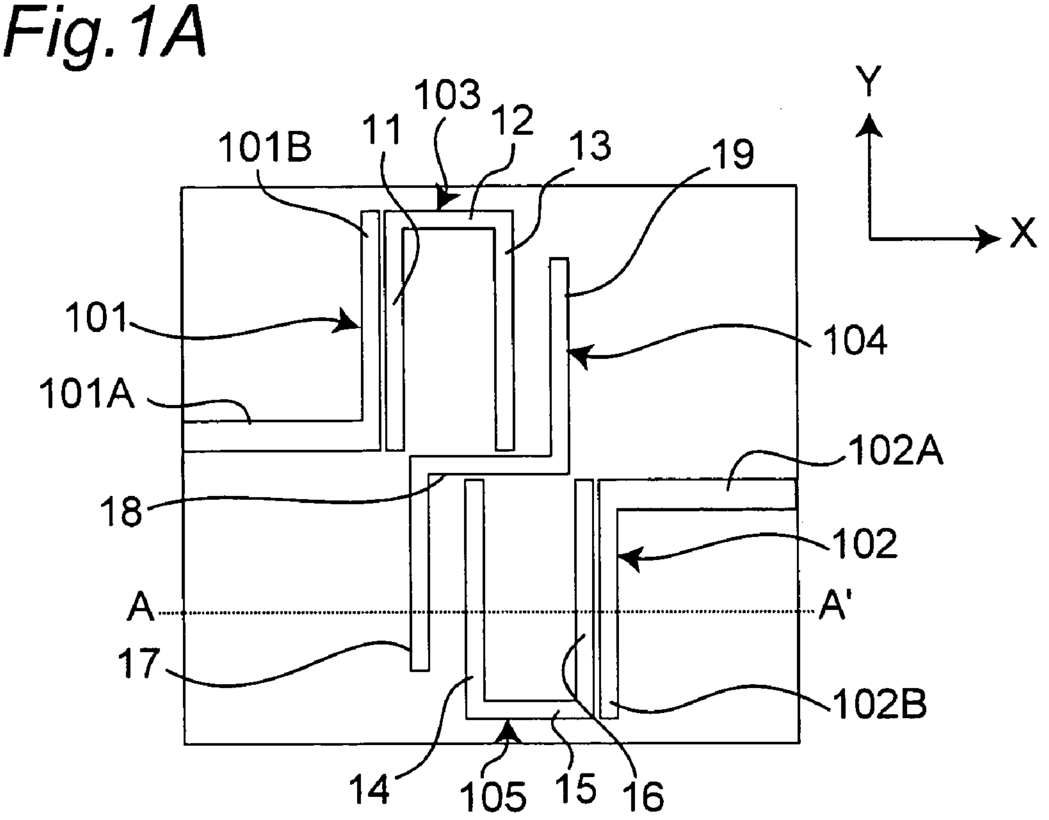
FIG. 1A is a plan view showing a first embodiment of the planar filter of the present invention.
Figure 1B:
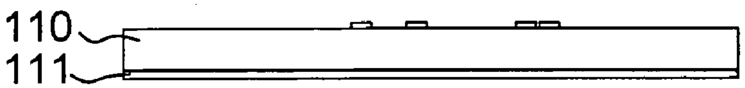
FIG. 1B is a cross sectional view taken along line A-A' in FIG. 1A, and FIGS. 1C, 1D and 1E are views respectively showing a first U-shaped open transmission line resonator, a crank-shaped open transmission line resonator and a second U-shaped open transmission line resonator that the first embodiment has.

FIGS. 1A and 1B show a planar filter in the first embodiment of the present invention. FIG. 1A is a plan view, and FIG. 1B is a cross sectional view taken along line A-A' in FIG. 1A. As shown in FIG. 1A, the planar filter in the first embodiment has a first input/output transmission line 101 serving as an input line, a second input/output transmission line 102 serving as an output line, a first U-shaped open transmission line resonator 103, a second U-shaped open transmission line resonator 105 and a crank-shaped open transmission line resonator 104, which are formed on a dielectric substrate 110. As shown in FIG. 1B, the dielectric substrate 110 has a grounding conductor 111 on its back face.

Figure 1C:
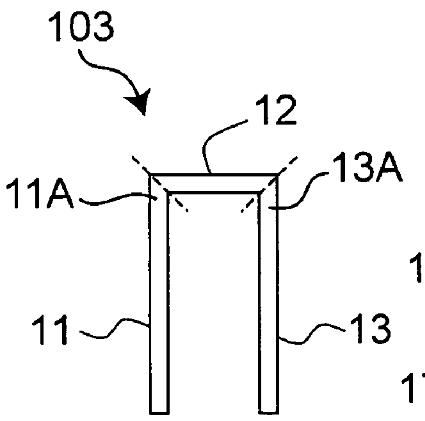

As shown in FIG. 1C, the first U-shaped open transmission line resonator 103 has bends so as to be in generally U shape, and is composed of three contiguous connected transmission lines 11, 12 and 13. The transmission lines 11 and 13 face each other in an almost parallel state, and the transmission line 12 connects one end 11A of the transmission line 11 and one end 13A of the transmission line 13. The transmission line 12 is bent at almost right angles at the end 11A of the transmission line 11 and the end 13A of the transmission line 13.

Figure 1D:
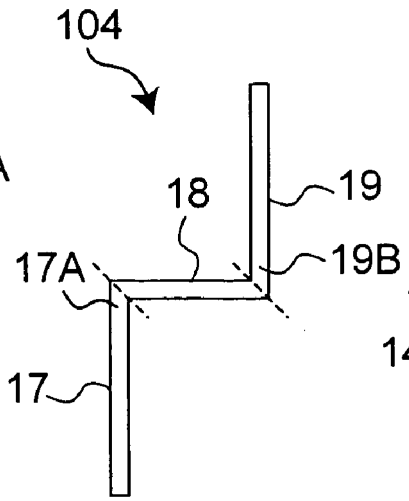

Moreover, as shown in FIG. 1D, the crank-shaped open transmission line resonator 104 has bends so as to be in generally crank shape, and is composed of three contiguous transmission lines 17, 18 and 19. The transmission lines 17 and 19 extend in an almost parallel state, and the transmission line 18 connects one end 17A of the transmission line 17 and one end 19B of the transmission line 19. The transmission line 18 is bent at almost right angles at the end 17A of the transmission line 17 and the end 19B of the transmission line 19.

Figure 1E:
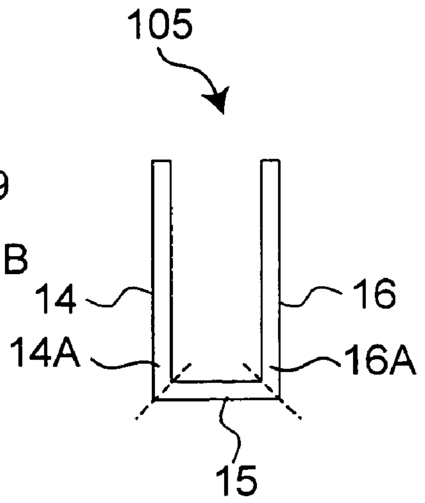

Moreover, as shown in FIG. 1E, the second U-shaped open transmission line resonator 105 has bends so as to be in generally U shape, and is composed of three contiguous transmission lines 14, 15 and 16. The transmission lines 14 and 16 face each other in an almost parallel state, and the transmission line 15 connects one end 14A of the transmission line 14 and one end 16A of the transmission line 16. The transmission line 15 is bent at almost right angles at the end 14A of the transmission line 14 and the end 16A of the transmission line 16.

In this embodiment, each of the first U-shaped open transmission line resonator 103, the second U-shaped open transmission line resonator 105 and the crank-shaped open transmission line resonator 104 has a line length which is approximately half an equivalent wavelength of a passband center frequency component.

Moreover, as shown in FIG. 1A, a section 101B of the first input/output transmission line 101 serving as the input line is in parallel proximity to the transmission line 11 of the first U-shaped open transmission line resonator 103 with a specified gap therebetween and is electromagnetically coupled to the transmission line 11. It is to be noted that the first input/output transmission line 101 serving as the input line is composed of a section 101A and the section 101B, and the section 101B extends from one end of the section 101A at almost right angles to the section 101A.

The transmission line 13 of the first U-shaped open transmission line resonator 103 and the transmission line 19 of the crank-shaped open transmission line resonator 104 are arranged in parallel proximity to each other with a specified gap therebetween so that portions of these transmission lines are electromagnetically coupled to each other.

Moreover, the transmission line 17 of the crank-shaped open transmission line resonator 104 and the transmission line 14 of the second U-shaped open transmission line resonator 105 are arranged in parallel proximity to each other with a specified gap therebetween so as to be electromagnetically coupled to each other. Further, the transmission line 16 of the second U-shaped open transmission line resonator 105 and a section 102B of the second input/output transmission line 102 serving as the output line are arranged in parallel proximity to each other with a specified gap therebetween so as to be electromagnetically coupled to each other.

As shown in FIG. 1A, in the planar filter in the first embodiment, the crank-shaped open transmission line resonator 104 is arranged in between the first input/output transmission line 101 and the second input/output transmission line 102. Further, the transmission line 18 of the crank-shaped open transmission line resonator 104 extends in almost parallel to the section 101A of the first input/output transmission line 101 and a section 102A of the second input/output transmission line 102. In FIG. 1A, the direction along which the sections 101A, 102A extend is referred to as "X direction", and the direction perpendicular to the X direction is referred to as "Y direction". Moreover, the transmission lines 17 and 19 of the crank-shaped open transmission line resonator 104 extend in opposite directions from both ends of the transmission line 18 at almost right angles to the transmission line 18. Further, on both sides of the transmission line 18 of the crank-shaped open transmission line resonator 104 in the Y direction, the first U-shaped open transmission line resonator 103 and the second U-shaped open transmission line resonator 105 are disposed. The first U-shaped open transmission line resonator 103 and the second U-shaped open transmission line resonator 105 face each other in the Y direction, with their open ends displaced in the X direction.

Moreover, as shown in FIG. 1A, in the first embodiment, the gap between the section 101B of the first input/output transmission line 101 and the transmission line 11 of the first U-shaped open transmission line resonator 103 is smaller than the gap between the transmission line 13 of the first U-shaped open transmission line resonator 103 and the transmission line 19 of the crank-shaped open transmission line resonator 104. Further, the gap between the section 102B of the second input/output transmission line 102 and the transmission line 16 of the second U-shaped open transmission line resonator 105 is smaller than the gap between the transmission line 14 of the second U-shaped open transmission line resonator 103 and the transmission line 17 of the crank-shaped open transmission line resonator 104.

According to the thus-constructed planar filter, having the first and second U-shaped open transmission line resonators 103, 105 which are bent in U shape and the crank-shaped open transmission line resonator 104 which is bent in crank shape makes it possible to decrease the area to be actually occupied by the filter on the dielectric substrate 110. This allows downsizing of a device having the planar filter.

Further, in the first embodiment, the first and second U-shaped open transmission line resonators 103, 105 and the crank-shaped open transmission line resonator 104 have a line length which is half an equivalent wavelength of a pass-band center frequency component, which makes it possible to enhance the wave filtration characteristic.

Further, in the first embodiment, the shape and arrangement of the thus-structured first and second U-shaped open transmission line resonators 103, 105 and the crank-shaped open transmission line resonator 104 make it possible to decrease the area on the dielectric substrate 110 to be actually occupied by the filter and enhance the attenuation characteristic, which in turn enables downsizing of a device employing the planar filter.

In other words, according to the embodiment, the shapes and arrangement of the above-described resonators make it possible to realize a filter that is equal to the conventional filter in terms of functions, and still allows compact integration with an IC (Integrated Circuit).

Although in the embodiment, the first U-shaped open transmission line resonator 103, the second U-shaped open transmission line resonator 105 and the crank-shaped open transmission line resonator 104 are constructed by angularly bending straight lines, the straight lines may be gently bent in a curved shape, or corners of the bent straight lines may be cut off.

Further, although in the embodiment, the transmission lines 11 to 13, the transmission lines 14 to 16 and the transmission lines 17 to 19 are micro strip lines, they may be strip lines, suspended lines or coplanar lines. Moreover, although in the embodiment, the first input/output transmission line 101 serves as the input line and the second input/output transmission line 102 serves as the output line, the first input/output transmission line 101 may serve as the output line and the second input/output transmission line 102 may serve as the input line.

Second Embodiment

Figure 2A:
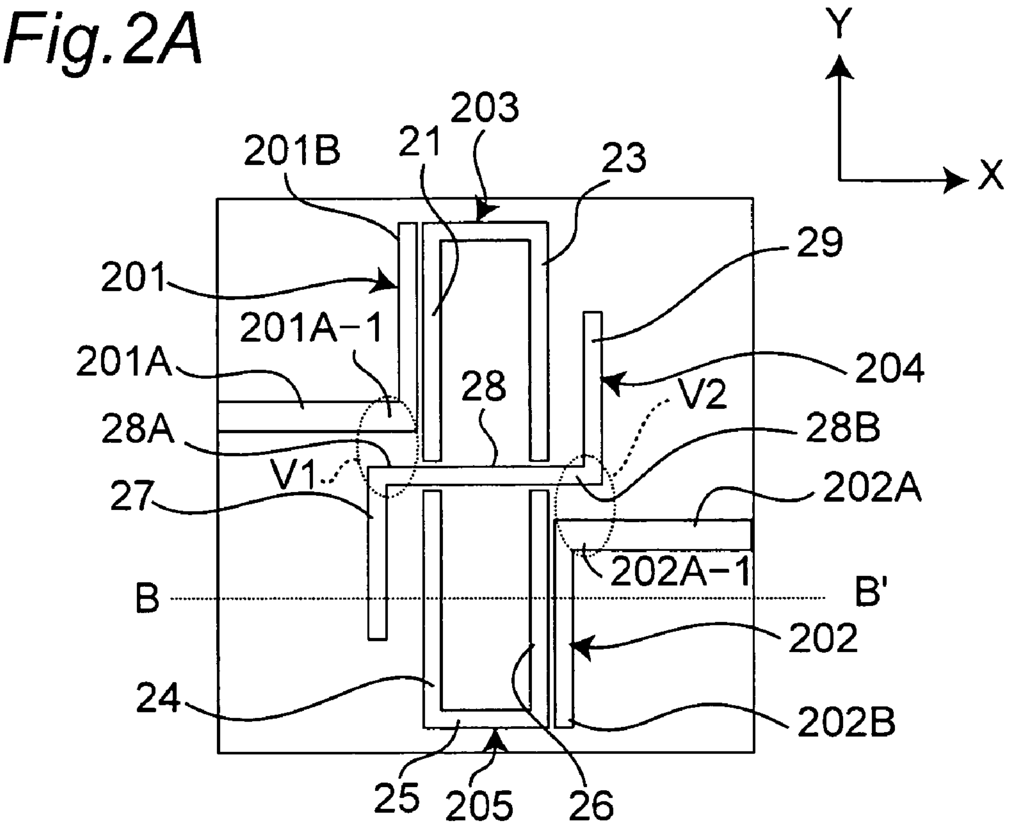
FIG. 2A is a plan view showing a second embodiment of the planar filter of the present invention.
Figure 2B:
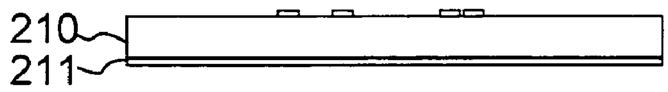
FIG. 2B is a cross sectional view taken along line A-A' in FIG. 2A, and FIGS. 2C, 2D and 2E are views respectively showing a first U-shaped open transmission line resonator, a crank-shaped open transmission line resonator and a second U-shaped open transmission line resonator that the second embodiment has.

FIGS. 2A and 2B show a planar filter in the second embodiment of the present invention. FIG. 2A is a plan view, and FIG. 2B is a cross sectional view taken along line B-B' in FIG. 2A.

The planar filter in the second embodiment has a first input/output transmission line 201 serving as an input line, a second input/output transmission line 202 serving as an output line, a first U-shaped open transmission line resonator 203, a second U-shaped open transmission line resonator 205 and a crank-shaped open transmission line resonator 204, which are formed on a semi-insulative gallium arsenide substrate 210 of a thickness of 70 μm. As shown in FIG. 2B, the semi-insulative gallium arsenide substrate 210 has a grounding conductor 211 on its back face.

Figure 2C:
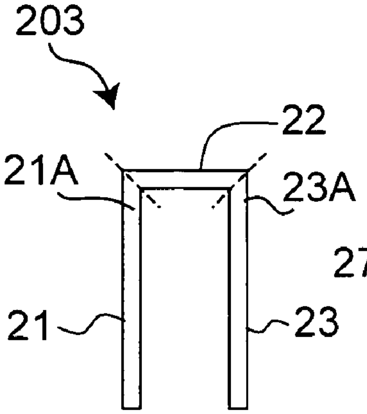

As shown in FIG. 2C, the first U-shaped open transmission line resonator 203 has bends so as to be in generally U shape, and is composed of three contiguous connected transmission lines 21, 22 and 23. The transmission lines 21 and 23 face each other in an almost parallel state, and the transmission line 22 connects one end 21A of the transmission line 21 and one end 23A of the transmission line 23. The transmission line 22 is bent at almost right angles at the end 21A of the transmission line 21 and the end 23A of the transmission line 23.

Figure 2D:
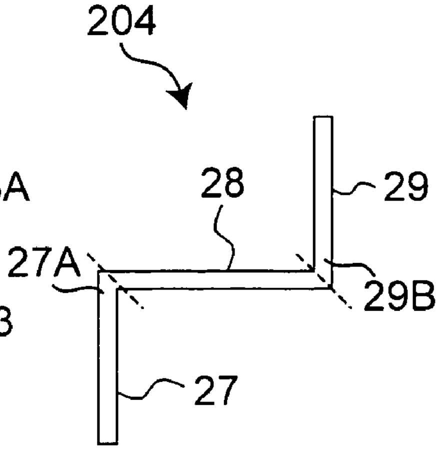

Moreover, as shown in FIG. 2D, the crank-shaped open transmission line resonator 204 has bends so as to be in generally crank shape, and is composed of three contiguous transmission lines 27, 28 and 29. The transmission lines 27 and 29 extend in an almost parallel state, and the transmission line 28 connects one end 27A of the transmission line 27 and one end 29B of the transmission line 29. The transmission line 28 is bent at almost right angles at the end 27A of the transmission line 27 and the end 29B of the transmission line 29.

Figure 2E:
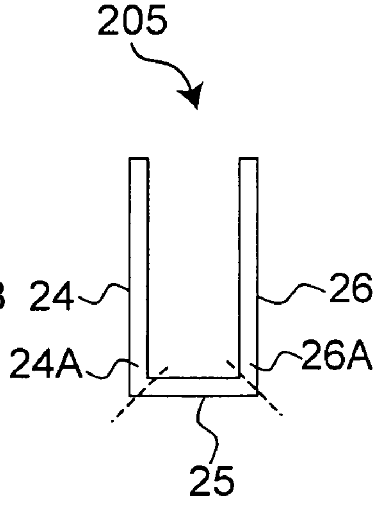

Moreover, as shown in FIG. 2E, the second U-shaped open transmission line resonator 205 has bends so as to be in generally U shape, and is composed of three contiguous transmission lines 24, 25 and 26. The transmission lines 24 and 26 face each other in an almost parallel state, and the transmission line 25 connects one end 24A of the transmission line 24 and one end 26A of the transmission line 26. The transmission line 25 is bent at almost right angles at the end 24A of the transmission line 24 and the end 26A of the transmission line 26.

In the second embodiment, the transmission lines 21-29 each have a thickness of 10 μm and a width of 30 μm. The transmission lines 21, 23, 24 and 26 each have a center length of 385 μm, the transmission lines 22 and 25 each have a center length of 180 μm, the transmission lines 27 and 29 each have a center length of 275 μm, and the transmission line 28 has a center length of 360 μm. Each of the first U-shaped open transmission line resonator 203, the second U-shaped open transmission line resonator 205 and the crank-shaped open transmission line resonator 204 has a line length which is approximately half an equivalent wavelength of a passband center frequency component.

Moreover, as shown in FIG. 2A, a section 201B of the first input/output transmission line 201 serving as the input line is in parallel proximity to the transmission line 21 of the first U-shaped open transmission line resonator 203 with a gap of 10 μm therebetween so as to be electromagnetically coupled to the transmission line 21. It is to be noted that the first input/output transmission line 201 serving as the input line is composed of a section 201A and the section 201B, and the section 201B extends from one end of the section 201A at almost right angles to the section 201A.

The transmission line 23 of the first U-shaped open transmission line resonator 203 and the transmission line 29 of the crank-shaped open transmission line resonator 204 are arranged in parallel proximity to each other with a gap of 60 μm therebetween so that portions of these transmission lines are electromagnetically coupled to each other.

Moreover, the transmission line 27 of the crank-shaped open transmission line resonator 204 and the transmission line 24 of the second U-shaped open transmission line resonator 205 are arranged in parallel proximity to each other with a gap of 60 μm therebetween so as to be electromagnetically coupled to each other. Further, the transmission line 26 of the second U-shaped open transmission line resonator 205 and a section 202B of the second input/output transmission line 202 serving as the output line are arranged in parallel proximity to each other with a gap of 10 μm therebetween so as to be electromagnetically coupled to each other.

As shown in FIG. 2A, in the planar filter in the second embodiment, the crank-shaped open transmission line resonator 204 is arranged in between the first input/output transmission line 201 serving as the input line and the second input/output transmission line 202 serving as the output line. Further, the transmission line 28 of the crank-shaped open transmission line resonator 204 extends in almost parallel to the section 201A of the first input/output transmission line 201 serving as the input line and a section 202A of the second input/output transmission line 202 serving as the output line. In FIG. 2A, the direction along which the sections 201A, 202A extend is referred to as "X direction", and the direction perpendicular to the X direction is referred to as "Y direction". Moreover, the transmission lines 27 and 29 of the crank-shaped open transmission line resonator 204 extend in opposite directions from both ends of the transmission line 28 at almost right angles to the transmission line 28. Further, on both sides of the transmission line 28 of the crank-shaped open transmission line resonator 204 in the Y direction, the first U-shaped open transmission line resonator 203 and the second U-shaped open transmission line resonator 205 are disposed. The first U-shaped open transmission line resonator 203 and the second U-shaped open transmission line resonator 205 face each other in the Y direction, without displacement of their open ends in the X direction.

The second embodiment is different from the first embodiment in that in a region V1 surrounded with a dotted line in FIG. 2A, a part 201A-1 adjacent to the section 201B of the section 201A of the transmission line 201 serving as the input line is arranged in parallel proximity to an end section 28A of the transmission line 28 of the crank-shaped open transmission line resonator 204 with a gap of 60 μm therebetween so that they are electromagnetically coupled to each other. Moreover, in a region V2 surrounded with a dotted line in FIG. 2A, a part 202A-1 adjacent to the section 202B of the section 202A of the transmission line 202 serving as the output line is arranged in parallel proximity to an end section 28B of the transmission line 28 in the crank-shaped open transmission line resonator 204 with a gap of 60 μm therebetween so that those parts are electromagnetically coupled to each other.

According to the thus-constructed second embodiment, in addition to a first signal transmission route on which a signal is transmitted in the order of the transmission line 201 serving as the input line, the first U-shaped open transmission line resonator 203, the crank-shaped open transmission line resonator 204, the second U-shaped open transmission line resonator 205 and the transmission line 202 serving as the output line, there is formed a second signal transmission route on which a signal is transmitted in the order of the transmission line 201 serving as the input line, the crank-shaped open transmission line resonator 204 and the transmission line 202 serving as the output line. This allows mutual cancellation of signals in an attenuation band in the close vicinity of the pass band. Therefore, a large attenuation characteristic can be obtained in a frequency band which requires attenuation.

Figure 3:
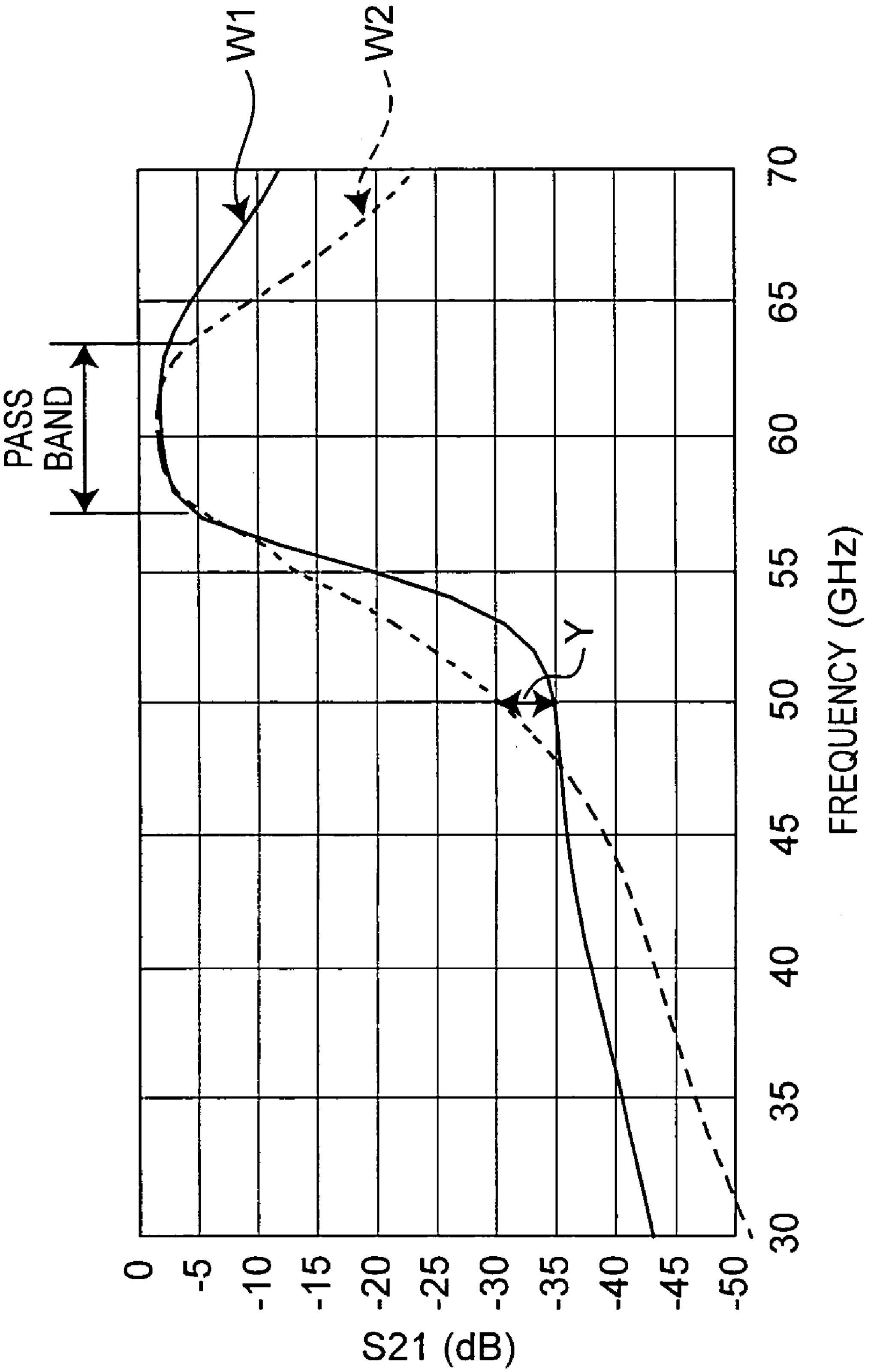
FIG. 3 is a graph showing a frequency characteristic of the planar filter in the second embodiment.

FIG. 3 illustrates the transmission characteristic of the planar filter in the second embodiment by a transmission characteristic curve W1 drawn with a solid line. A transmission characteristic curve W2 drawn with a broken line in FIG. 3 shows the transmission characteristic of the conventional planar filter. It is to be noted that the planar filter of the second embodiment and the conventional planar filter were formed through the same process with use of the same substrates. As is clear from the comparison between the transmission characteristic curve W1 and the transmission characteristic curve W2, a passing loss within the passband in the second embodiment is almost identical to that in the conventional example, but within the attenuation band in the range of 47 to 57 GHz, a larger attenuation characteristic was obtained in the second embodiment than in the conventional example. In terms of the characteristic shown in FIG. 3, at a frequency of 50 GHz for example, an absolute value of a transmission coefficient S21 (S parameter) in the second embodiment is larger by 5 (dB) than that in the conventional example, as indicated by reference symbol Y.

Thus, the planar filter in the second embodiment can achieve sufficient wave filtering performance while being more compact than the conventional planar filter.

Figure 7:
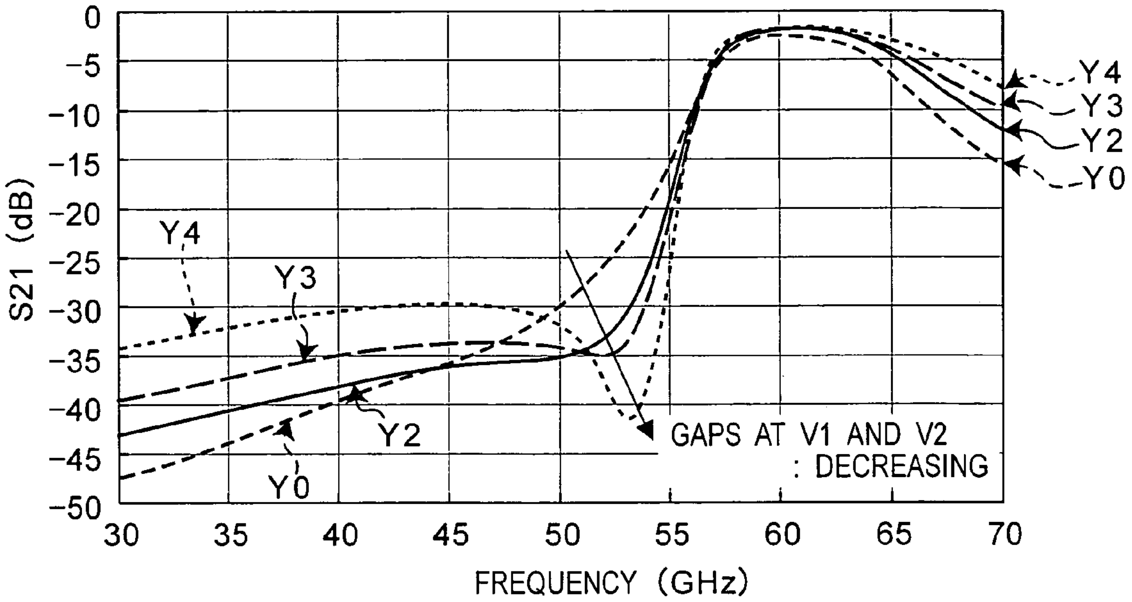
FIG. 7 is a graph showing changes in a passing characteristic of the planar filter in the second embodiment of the present invention in the case where a gap between an input/output transmission line and the crank-shaped open transmission line resonator is changed, to show the effect of electromagnetic coupling between the input/output transmission line and the crank-shaped open transmission line resonator.

Now, in order to demonstrate the effect of the electromagnetic coupling in the region V1 and the region V2 in FIG. 2A, FIG. 7 shows a passing characteristic of the filter in the case where the gap length in each of the region V1 and the region V2 is changed. In FIG. 7, transmission characteristic Y2, which is equal to the transmission characteristic W1 in FIG. 3, is a transmission characteristic of the planar filter in which the gap length in each of the region V1 and the region V2 is 60 μm. Further, in FIG. 7, transmission characteristic Y3 is a transmission characteristic of the planar filter in which the gap length in each of the region V1 and the region V2 is 30 μm.

Further, transmission characteristic Y4 is a transmission characteristic of the planar filter in which each of the gap length in the region V1 and the region V2 is 10 μm.

The gap length was changed by fixing the positions of the open ends of the section 201B of the transmission line 201 and the section 202B of the transmission line 202 in FIG. 2A and by translating the section 201A and the section 202A. Moreover, characteristic Y0 shown in FIG. 7 is a transmission characteristic in the case where the input/output transmission lines 201, 202 and the crank-shaped open transmission line resonator 204 are intentionally arranged so as not to be electromagnetically coupled to each other, namely, characteristic Y0 is a transmission characteristic of the planar filter having the FIG. 1 construction described in connection with the first embodiment.

As shown in FIG. 7, with the decreasing gap length in the region V1 and the region V2, the electromagnetic coupling between the input/output transmission lines 201, 202 and the crank-shaped open transmission line resonator 204 is increased, and a larger attenuation pole is formed in the frequency range of 51 to 54 GHz, whereas in the frequency range of 51 GHz or lower, the attenuation characteristic is deteriorated. AS is apparent, optimizing the gap length in the region V1 and the region V2 allows adjustment of the attenuation characteristic in a desired frequency band in conformity to a target specification.

Although in the second embodiment, the first U-shaped open transmission line resonator 203, the second U-shaped open transmission line resonator 205 and the crank-shaped open transmission line resonator 204 are constructed by angularly bending straight lines, the straight lines may be gently bent in a curved shape, or corners of the bent straight lines may be cut off.

Further, although in the second embodiment a semi-insulating gallium arsenide substrate is used as the dielectric substrate, other substrates made of semiconductor such as indium phosphorus, gallium nitride, silicon and so on may be employed. Further, the planar filter of the present invention can be constructed by employing a substrate made of ceramics such as alumina or glass, or a substrate made of a resin such as Teflon (trade name of polytetrafluoroethylene made by DuPont).

Further, although in the second embodiment the transmission lines are micro strip lines, they may be strip lines, suspended lines or coplanar lines. Moreover, although in the second embodiment, the first input/output transmission line 201 serves as the input line and the second input/output transmission line 202 serves as the output line, the first input/output transmission line 201 may be used as the output line, and the second input/output transmission line 202 as the input line. Also, although the second embodiment is an example of a millimeter wave band planar filter, the present invention is also applicable to microwave band planar filters.

Third Embodiment

Figure 4A:
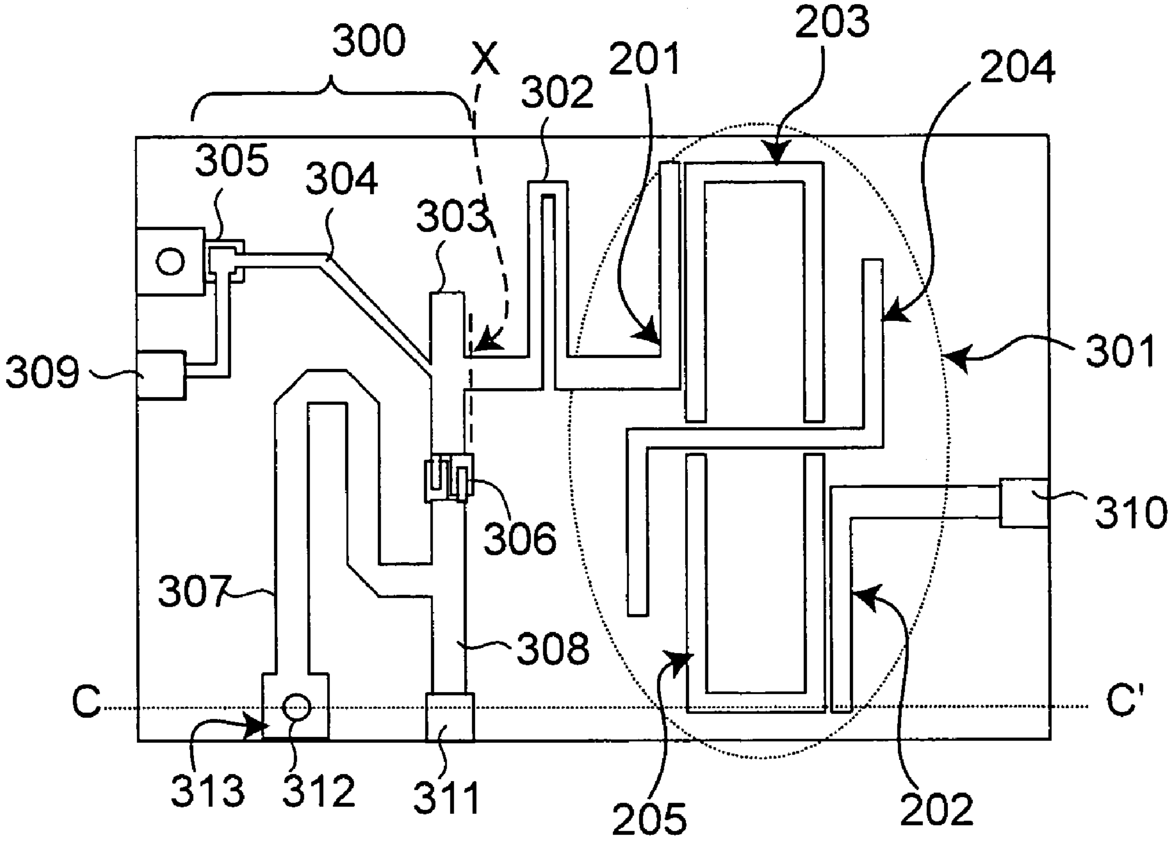
FIG. 4A is a plan view showing a planar filter-integrated even-harmonic mixer as a third embodiment of the present invention.
Figure 4B:
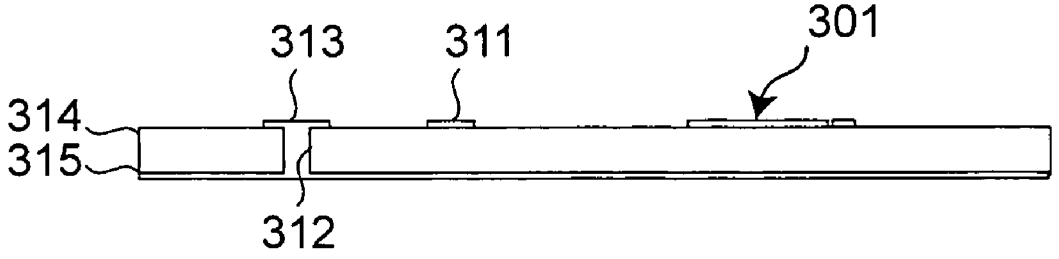
FIG. 4B is a cross sectional view taken along line C-C' in FIG. 4A.

Next, FIGS. 4A and 4B show a planar filter-integrated even-harmonic mixer device that is a semiconductor device as a third embodiment of the present invention. FIG. 4A is a plan view and FIG. 4B is a cross sectional view taken along line C-C' in FIG. 4A. The planar filter-integrated even-harmonic mixer device in the third embodiment is formed by integrating a planar filter 301 according to the second embodiment shown in FIG. 2 with an even-harmonic mixer 300 on a semiconductor substrate.

The even-harmonic mixer device in the third embodiment is an up-converter even-harmonic mixer device for converting an intermediate-frequency signal to a high-frequency signal. The mixer device receives an intermediate-frequency signal (having a frequency ($f_{IF}$)) and a local oscillation signal (having a frequency ($f_{LO}$)), and mixes the intermediate-frequency signal and the local oscillation signal to output a high-frequency signal (having a frequency ($f_{RF}$)). The frequency ($f_{IF}$), the frequency ($f_{LO}$) and the frequency ($f_{RF}$) have a relationship expressed by the following equation (1):

$$f_{RF}=2\times f_{LO}+f_{IF}. \tag{1}$$

In the third embodiment, it is assumed that the frequency $f_{LO}$ of the local oscillation signal is 27.769 GHz, the frequency $f_{IF}$ of the intermediate-frequency signal is 3.471 to 5.546 GHz, and that the frequency $f_{RF}$ of the high-frequency signal is 59.01 to 61.085 GHz. The gallium arsenide substrate has a size of approximately 1.5 mm×1.0 mm, and the substrate has a thickness of 70 μm.

The planar filter-integrated even-harmonic mixer device of the third embodiment has the even-harmonic mixer 300, a phase adjustment transmission line 302 and the planar filter 301.

The even-harmonic mixer 300 is connected to between an intermediate-frequency signal terminal 309 and the phase adjustment transmission line 302. The even-harmonic mixer 300 has an MIM (Metal Insulator Metal) capacitor 305 connected to the intermediate-frequency signal terminal 309, an intermediate-frequency signal transmission line 304 connecting the MIM capacitor 305 to an open stub 30, and an anti-parallel diode pair 306 connected to the open stub 303. Further, the even-harmonic mixer 300 has a local oscillation signal transmission line 308 connecting the anti-parallel diode pair 306 to a local oscillation signal terminal 311, and a short stub 307 connecting the local oscillation signal transmission line 308 to a pad 313. As shown in FIG. 4B, the pad 313 is connected via a through hole 312 formed through a gallium arsenide substrate 314 to a grounding conductor 315 formed on the back face of the gallium arsenide substrate 314. The anti-parallel diode pair 306 is formed on the gallium arsenide substrate 314 through a semiconductor process.

Moreover, each of the short stub 307 and the local oscillation signal transmission line 308 has a line width of 50 μm so that the characteristic impedance becomes approximately 50Ω. Moreover, the intermediate frequency signal transmission line 304 is formed to have a line width of 20 μm so that the characteristic impedance becomes approximately 70Ω. The stub 307, the transmission line 304 and the transmission line 308 are properly bent to reduce the total size.

The length of the open stub 307 including the length of the through hole 312 and the pad 313 is set so as to be about one quarter of the wavelength of the local oscillation signal of frequency $f_{LO}$. The MIM capacitor 305 is set to 0.4 pF so that the capacitor displays high impedance with respect to the intermediate frequency signal (having a frequency of $f_{IF}$) and low impedance with respect to the high-frequency signal (having a frequency of $f_{RF}$).

Further, the phase adjustment transmission line 302 is almost equivalent to a transmission line of 50Ω, and has a function to delay only the phase without changing the amplitude. The phase adjustment transmission line 302 is adjusted so that when an inputted signal is at the frequency $f_{LO}$, the impedance on the right-hand side as viewed from connection point X in FIG. 4A (i.e., the side of the phase adjustment transmission line 302 and the filter 301) becomes almost zero. Therefore, the connection point X in the phase adjustment transmission line 302 can be regarded as equivalent to grounding with respect to the signal of the frequency $f_{LO}$.

Further, a local oscillation signal of the frequency $f_{LO}$ inputted from the local oscillation signal terminal 311 is supplied through the local oscillation signal transmission line 308 to the anti-parallel diode pair 306. Because the short stub 307 has a length set to be a quarter wavelength with respect to the signal of the frequency $f_{LO}$, the stub becomes equivalent to being open with respect to the signal of the frequency $f_{LO}$, and this means that nothing is practically connected.

Also, because the impedance on the right-hand side as viewed from the connection point X in FIG. 4A is almost zero with respect to the signal of the frequency $f_{LO}$, the connection point X practically almost satisfies the condition of grounding with respect to the signal of the frequency $f_{LO}$. Therefore, all the voltage of the local oscillation signal of the frequency $f_{LO}$ inputted from the local oscillation signal terminal 311 is applied to the anti-parallel diode pair 306.

The local oscillation signal inputted from the local oscillation signal terminal 311 and the intermediate-frequency signal of the frequency $f_{IF}$ inputted from the intermediate-frequency signal terminal 309 are mixed in the anti-parallel diode pair 306, as a result of which signals with various frequency components are generated.

Among these signals with various frequency components, only a signal with a frequency component which satisfies the equation (1), e.g., ($f_{RF}=2\times f_{LO}+f_{IF}$), passes through the bandpass filter 301. Unnecessary signals having other frequency components, which do not satisfy the equation (1), cannot pass through the bandpass filter 301, but are reflected thereby. Moreover, among these unnecessary signals, signals particularly high in signal intensity, i.e., signal waves at a frequency of from 49.992 GHz to 52.067 GHz, or ($2\times f_{LO}+f_{IF}$) can be considerably attenuated by the planar filter 301 having a characteristic W1 shown by solid line in FIG. 3.

As a result, in the planar filter-integrated even-harmonic mixer device in the third embodiment, only the signal having the frequency of $f_{RF}$ ($=2\times f_{LO}+f_{IF}$) is outputted from a high-frequency signal terminal 310. It is to be noted that the open stub 303 is intended to achieve matching between the even-harmonic mixer 300 and the planar filter 301 with respect to the signal of the frequency $f_{RF}$.

Since the intermediate-frequency signal transmission line 304 has a length set to be a quarter wavelength of the signal of the frequency $f_{RF}$, the transmission line becomes equivalent to being open with respect to the signal of the frequency $f_{RF}$, and this means that nothing is practically connected. Consequently, the signal of the frequency $f_{RF}$ is not outputted from the intermediate-frequency signal terminal 309.

Further, if the frequency $f_{IF}$ of the intermediate-frequency signal is much smaller than the frequency $f_{RF}$ of the high-frequency signal, then the following equation (2) is satisfied:

$$f_{RF}\approx 2\times f_{LO} \quad (2)$$

Therefore, the short stub 307 comes to have approximately half wavelength with respect to the high-frequency signal of the frequency $f_{RF}$, and therefore becomes roughly equivalent to grounding for the high-frequency signal of the frequency $f_{RF}$. Therefore, the high-frequency signal of the frequency $f_{RF}$ is not outputted from the local oscillation signal terminal 311.

Figure 8:
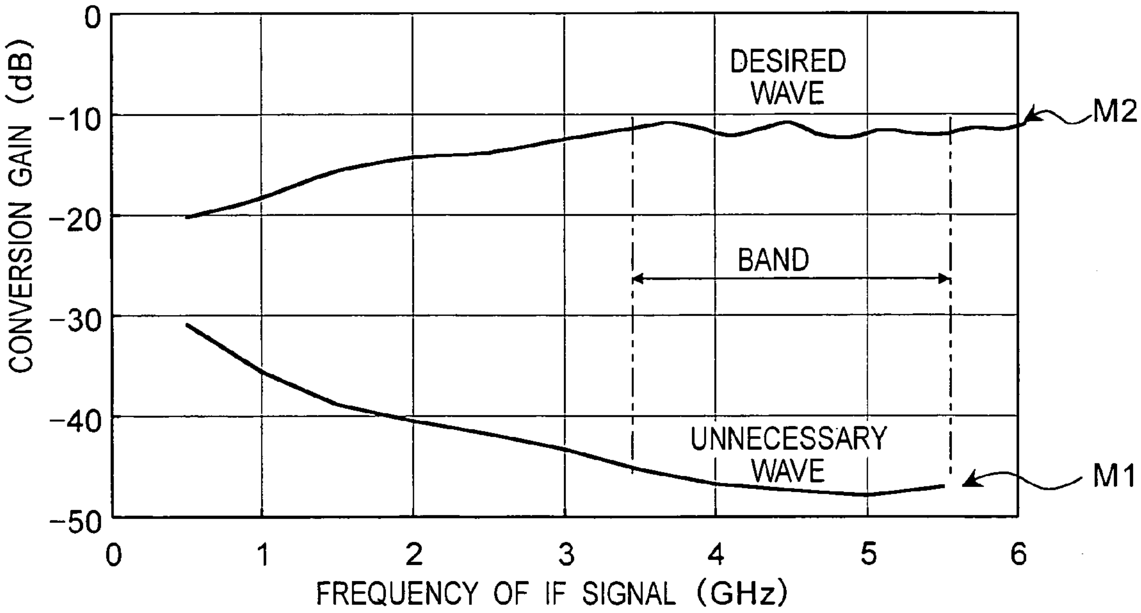
FIG. 8 is a diagram showing IF signal frequency dependence of conversion gain of a desired wave and an undesired wave in a planar filter-integrated even-harmonic mixer according to a third embodiment of the present invention.

FIG. 8 shows one example of the characteristic of the even-harmonic mixer device. In FIG. 8, the horizontal axis represents a frequency of the IF signal, i.e., an intermediate-frequency signal $f_{IF}$, whereas the vertical axis represents a conversion gain. More particularly, the graph shows a ratio of output power to input power in the IF signal. In FIG. 8, M1 represents conversion gains of the unnecessary waves having frequencies of ($2\times f_{LO}-f_{IF}$), while M2 denotes conversion gains of the desired waves having the frequencies of ($2\times f_{LO}+f_{IF}$).

Within the desired intermediate-frequency band of from 3.471 GHz to 5.546 GHz, the conversion gain M2 is approx. −12 dB, whereas the conversion gain M1 is −45 dB or lower, and therefore the difference between the conversion gains is 33 dB or larger. This indicates that output of the unnecessary wave is as small as 1/1000 of output of the desired wave or less.

Thus, in the planar filter-integrated even-harmonic mixer device in the third embodiment, integrating the planar filter 301 with the even-harmonic mixer 300 on the same chip allows realization of a semiconductor device with extremely small output of the unnecessary wave. Moreover, since the power loss at the connection point X between the even-harmonic mixer 300 and the planar filter 301 can be minimized, the performance is increased.

Further, as in the case of using the phase adjustment transmission line 302 to implement equivalent grounding for the local oscillation signal of the frequency $f_{LO}$, part of the characteristic of the planar filter 301 in the present invention may be utilized in designing the even-harmonic mixer 300, which makes it possible to simplify the circuit and realize a downsized semiconductor device.

It is to be noted that although the semi-insulative gallium arsenide substrate 314 is used as a semiconductor substrate in the embodiment, other semiconductor substrates made of indium phosphorus, gallium nitride, silicon and so on may be employed. Moreover, although the planar filter is integrated with the even-harmonic mixer on the semiconductor substrate in the embodiment, the planar filter may be integrated with a fundamental wave mixer, and a circuit including transistors such as amplifiers may be also mounted on the same chip.

Further, although description of the mixer device has been given of the function as an up-converter for converting an intermediate-frequency signal to a high-frequency signal in the embodiment, the mixer device may be used as a down-converter for converting a high-frequency signal to an intermediate-frequency signal.

Fourth Embodiment

Figure 5:
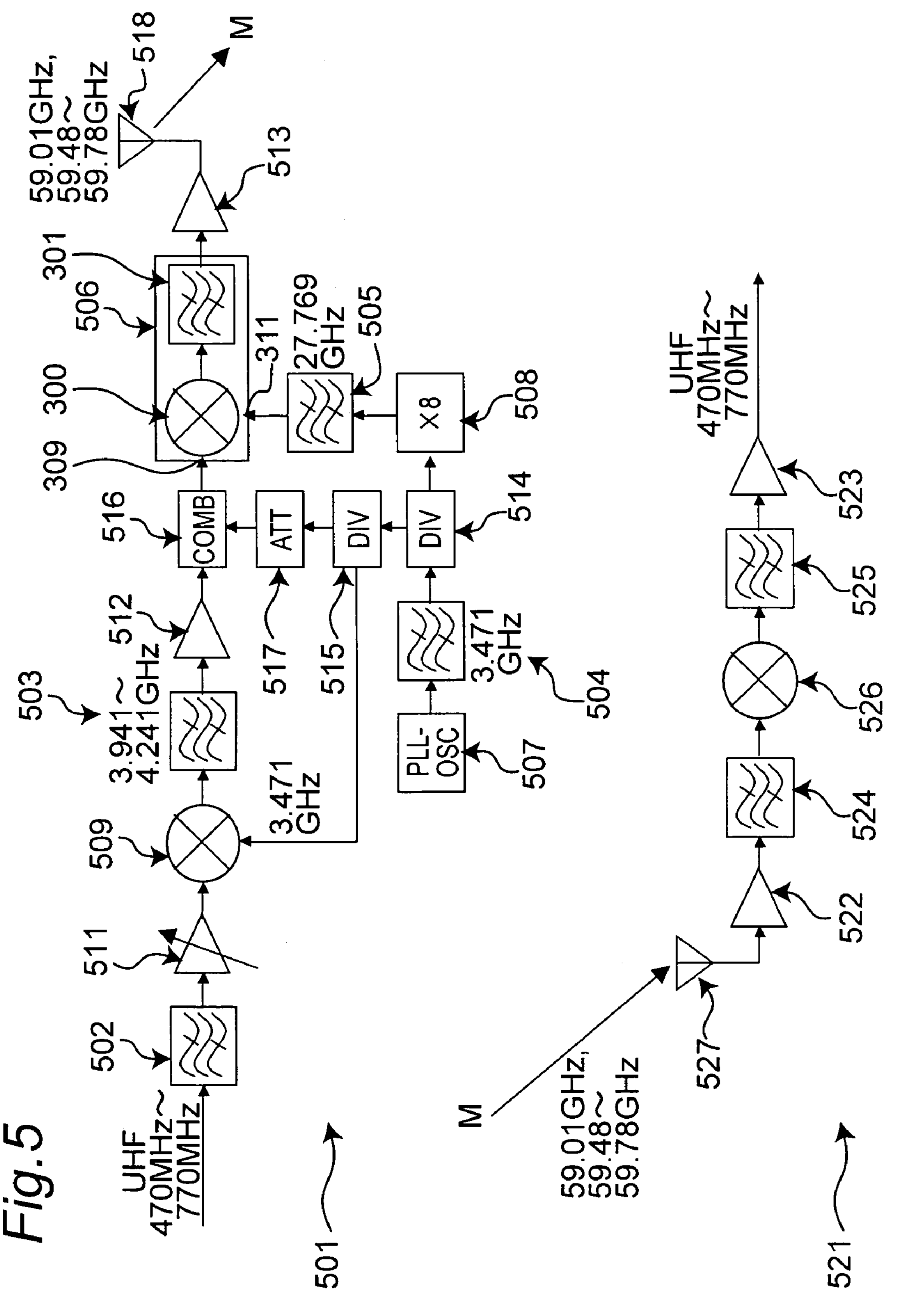
FIG. 5 is a block diagram showing a configuration example of a radio relay device as a fourth embodiment employing the planar filter of the present invention.
Figure 6A:
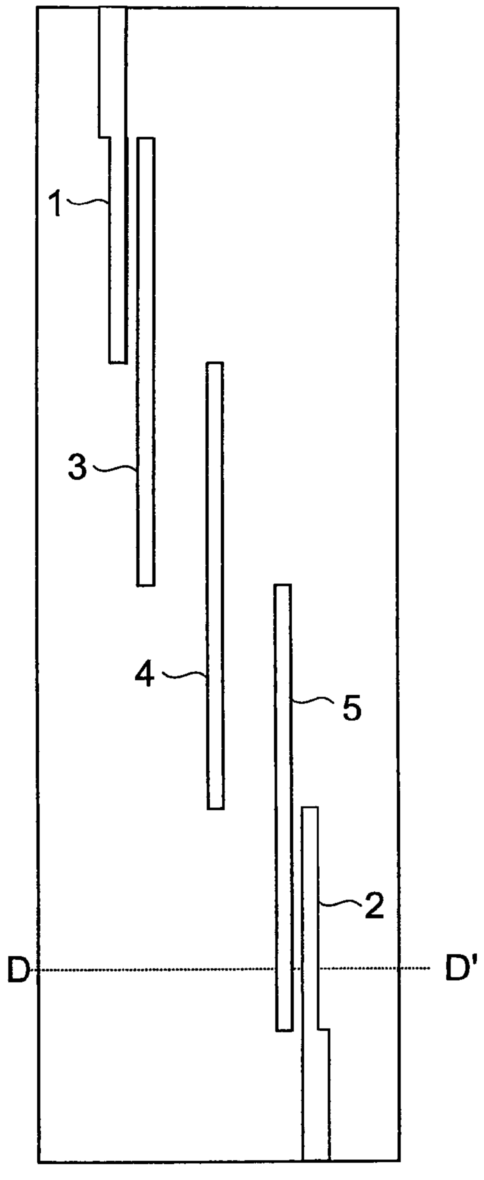
Fig.6A CONVENTIONAL ART
FIG. 6A is a plan view showing an example of a conventional planar filter.
Figure 6B:
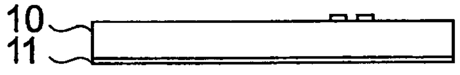
Fig.6B CONVENTIONAL ART
FIG. 6B is a cross sectional view taken along line D-D' in FIG. 6A.

Next, FIG. 5 shows a construction of a radio unit as a fourth embodiment of the present invention. The radio unit in the fourth embodiment is a radio relay device including a planar filter-integrated harmonic mixer 506 according to the third embodiment.

The radio relay device in the fourth embodiment has an up-converter 501 and a down-converter 521. The up-converter 501 up-converts a TV broadcast signal in a UHF band to a signal in a millimeter wave band and sends the signal wirelessly, whereas the down-converter 521 (receiver) receives the signal and down-converts the signal to a signal in the original UHF band.

The up-converter 501 has a bandpass filter 502 with a passband of from 470 to 770 MHz, a bandpass filter 503 with a passband of from 3.941 to 4.241 GHz, a bandpass filter 504 with a passband of 3.471 GHz and a bandpass filter 505 with a passband of 27.769 GHz.

Further, the up-converter 501 also has a phase locked oscillator 507 having an oscillation frequency of 3.471 GHz, an octupler 508, a mixer 509, amplifiers 511, 512, 513, dividers 514, 515, a combiner 516, an attenuator 517, an antenna 518, and the planar filter-integrated even-harmonic mixer 506 according to the third embodiment.

The down-converter 521 has amplifiers 522, 523, a millimeter wave filter 524, a bandpass filter 525 with a passband of from 470 to 770 MHz, a mixer 526 and an antenna 527.

Description will be given of the operation of the radio relay device in the fourth embodiment below.

First, in the up-converter 501, a local oscillation signal of 3.471 GHz outputted from the phase locked oscillator 507 is divided by the divider 514 into two signals after passing through the bandpass filter 504, and one of the two signals is inputted into the divider 515, while the other signal is inputted into the octupler 508. Next, in the divider 515, the input signal is further divided into two signals, and one signal is inputted into the mixer 509, while the other signal is inputted into the combiner 516 via the attenuator 517.

Moreover, the signal inputted into the octupler 508 is octupled to become a signal of 27.769 GHz, and after passing the bandpass filter 505, the signal is inputted into a local oscillation signal terminal of the planar filter-integrated even-harmonic mixer 506.

Moreover, a UHF signal of a frequency of 470-770 MHz passes through the bandpass filter 502 and the amplifier 511, and then in the mixer 509, the signal is up-converted to a signal of 3.941-4.241 GHz by a local oscillation signal of 3.471 GHz. Then, after passing the bandpass filter 503 and the amplifier 512, the signal is combined with a signal of 3.471 GHz in the combiner 516.

As a result, the signal in the band of from 3.941 to 4.241 GHz and the signal of 3.471 GHz are outputted from the combiner 516. These signals are inputted into the intermediate-frequency signal terminal 309 of the planar filter-integrated even-harmonic mixer 506, and mixed with a local oscillation signal of 27.769 GHz so as to be up-converted to a signal of 59.01 GHz and a signal of 59.48-59.78 GHz. After an unnecessary signal is removed by the planar filter 301 in the planar filter-integrated even-harmonic mixer 506, the remaining signal is amplified in the amplifier 513 and emitted to the air from the antenna 518 as a millimeter wave signal M.

In the down-converter 521, the signal in the band of 59.48-59.78 GHz and the signal of 59.01 GHz are received by the antenna 527, and are inputted into the mixer 526 via the amplifier 522 and the millimeter wave filter 524. In the mixer 526, the signal in the signal band of from 59.48 to 59.78 GHz and the signal of 59.01 GHz are mixed, and only a signal in a band of from 470 to 770 MHz is extracted by the bandpass filter 525 and amplified by the amplifier 523.

As a result, a signal is reproduced, which has a frequency in a waveband that agrees with the waveband (470-770 MHz) of the signal inputted into the up-converter 501.

According to the radio relay device of the fourth embodiment, inclusion of the planar filter-integrated even-harmonic mixer 506 of the present invention in the device allows reduction in component parts count of the up-converter 501 and downsizing of the device, as well as reduction in radiation of the unnecessary wave. It goes without saying that independent use of the planar filter 301 in the second embodiment instead of use of the planar filter-integrated even-harmonic mixer 506 still has a large effect on downsizing of the device and reduction in emission of the unnecessary wave.

Although description has been given of the radio relay device as one example of the radio unit in the fourth embodiment, the radio unit can be implemented as a radio communication device.

Fifth Embodiment

Figure 9:
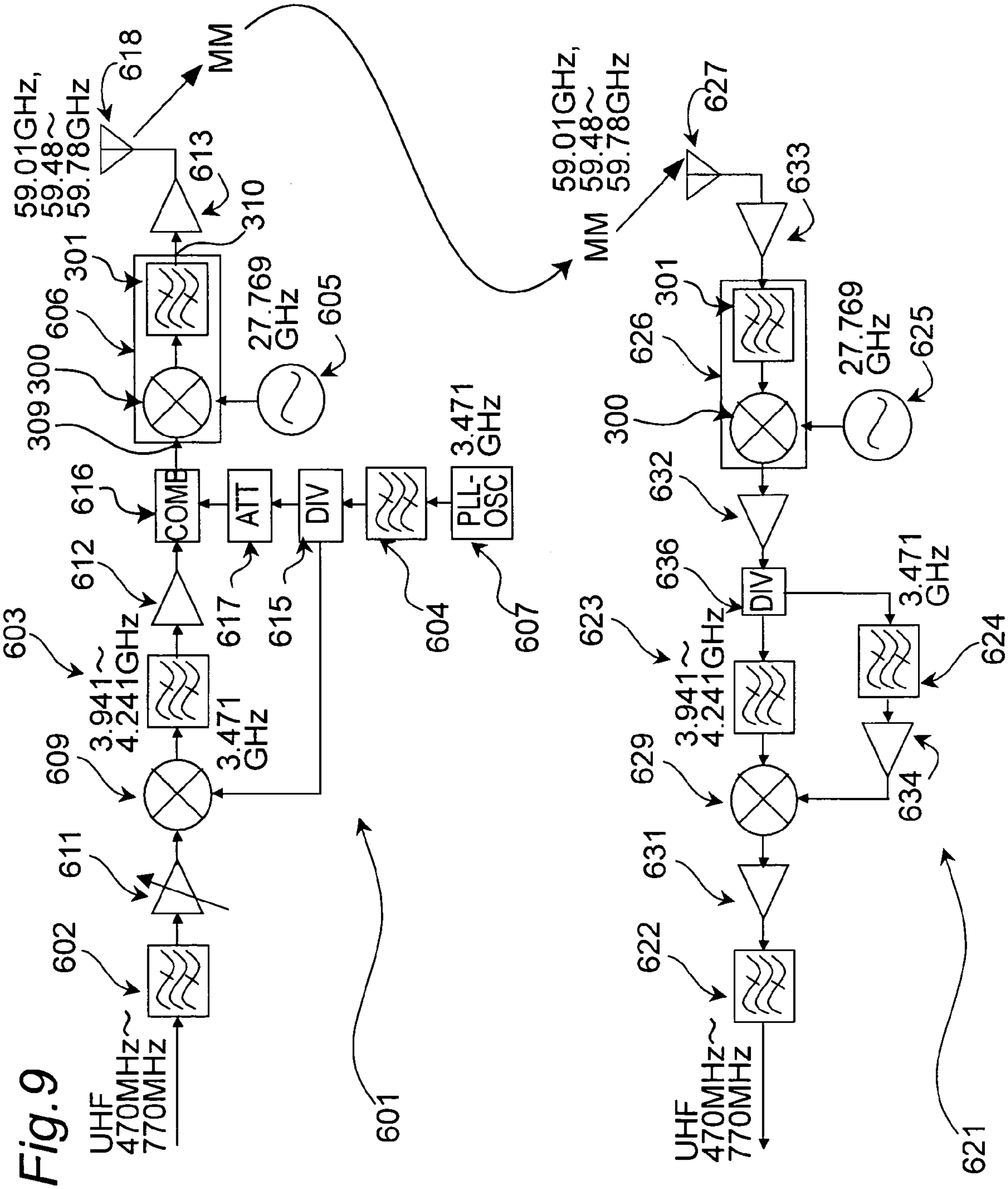
FIG. 9 is a block view showing a configuration example of a radio relay device as a fifth embodiment including the planar filter of the present invention.

Next, FIG. 9 shows the construction of a radio unit as a fifth embodiment of the present invention. The radio unit of the fifth embodiment is a radio relay device and includes a planar filter of the present invention.

The radio relay device has an up-converter 601 and a down-converter 621. The up-converter 601 up-converts a TV broadcast signal in a UHF band to a signal in a millimeter wave band and sends the signal wirelessly, whereas the down-converter 621 receives the signal and down-converts the signal to a signal in the original UHF band.

The up-converter 601 has a bandpass filter 602 with a passband of from 470 to 770 MHz, a bandpass filter 603 with a passband of from 3.941 to 4.241 GHz and a bandpass filter 604 with a passband of 3.471 GHz.

Further, the up-converter 601 also has a phase locked oscillator 607 having an oscillation frequency of 3.471 GHz, an oscillator 605 having an oscillation frequency of 27.769 GHz, a mixer 609, amplifiers 611, 612, 613, a divider 615, a combiner 616, an attenuator 617, an antenna 618, and a planar filter-integrated even-harmonic mixer 606 according to the third embodiment.

The down-converter 621 has a bandpass filter 622 with a passband of from 470 to 770 MHz, a bandpass filter 623 with a passband of from 3.941 to 4.241 GHz and a bandpass filter 624 with a passband of 3.471 GHz. The down-converter 621 also has an oscillator 625 having an oscillation frequency of 27.769 GHz, a mixer 629, amplifiers 631, 632, 633, 634, a divider 636, an antenna 627, and a planar filter-integrated even-harmonic mixer 626 according to the third embodiment.

The planar filter-integrated even-harmonic mixer 606 included in the up-converter 601 and the planar filter-integrated even-harmonic mixer 626 included in the down-converter 621 have the same construction.

Description will be given of the operation of the radio relay device in the fifth embodiment below.

First, in the up-converter 601, an oscillation signal of 3.471 GHz outputted from the phase locked oscillator 607 is divided by the divider 615 into two signals after passing through the bandpass filter 604, and one of the two signals is inputted in the mixer 609 as a local oscillation signal, while the other signal is inputted as a reference signal into the combiner 616 via the attenuator 617.

Moreover, a sine wave with a frequency of 27.769 GHz is produced in the oscillator 605, and inputted into a local oscillation signal terminal of the planar filter-integrated even-harmonic mixer 606.

Moreover, a UHF signal of a frequency of 470-770 MHz passes through the bandpass filter 602 and the amplifier 611, and then in the mixer 609, the signal is up-converted to a signal of 3.941-4.241 GHz by a local oscillation signal of 3.471 GHz. Then, after passing the bandpass filter 603 and the amplifier 612, the signal is combined with the reference signal of 3.471 GHz in the combiner 616.

As a result, the signal in the wave band of 3.941-4.241 GHz and the reference signal of 3.471 GHz are outputted from the combiner 616. These signals are inputted into the intermediate-frequency signal terminal 309 of the planar filter-integrated even-harmonic mixer 606, and mixed with a local oscillation signal of 27.769 GHz so as to be up-converted to a signal of 59.01 GHz and a signal in a waveband of from 59.48 GHz to 59.78 GHz. After unnecessary signal components are removed by the planar filter 301 in the planar filter-integrated even-harmonic mixer 606, the remaining signal is amplified in the amplifier 613 and emitted as a millimeter wave signal MM to the air from the antenna 618.

In the down-converter 621, the signal of 59.01 GHz and the signal in the band of 59.48-59.78 GHz are received at the antenna 627, and amplified in the amplifier 633 before being inputted into the mixer device 626. In the mixer device 626, the sine wave of 27.769 GHz produced in the oscillator 625, the signal of 59.01 GHz and the signal in the band of from 59.48 GHz to 59.78 GHz are mixed and down-converted to a signal in a band of 3.941-4.241 GHz and a reference signal of 3.471 GHz.

These signals are amplified by the amplifier 632 and divided by the divider 636 into two, and one of the two signals is inputted into the band filter 624 where only the reference signal of 3.471 GHz is extracted. The extracted signal is amplified by the amplifier 634 and then inputted into a local oscillation signal terminal of the mixer 629. The other signal from the divider 636 is inputted into the bandpass filter 623 where a signal in the band of 3.941-4.241 GHz is extracted, and the extracted signal is inputted into a high-frequency terminal of the mixer 629. In the mixer 629, the signal of the waveband of 3.941-4.241 GHz is mixed with the reference signal of 3.471 GHz inputted at the local oscillation signal terminal to thereby be down-converted, and after being amplified by the amplifier 631, the signal is inputted into the bandpass filter 622 by which only the signal in the band of 470-770 MHz is extracted.

In the radio relay device in the fifth embodiment, the reference signal of 3.471 GHz produced by the phase locked oscillator 607 of the up-converter 601 is up-converted by the planar filter-integrated even-harmonic mixer 606 and is down-converted by the planar filter-integrated even-harmonic mixer 626. Consequently, the reference signal having a frequency of 3.471 GHz produced by the phase locked oscillator 607 and then up-converted is back to a signal of a frequency of 3.471 GHz, although the latter signal includes phase noise from the oscillators 605 and 625.

Similarly, the TV broadcast signal wave is up-converted and down-converted by the planar filter-integrated even-harmonic mixers 606 and 626. Consequently, the TV broadcast signal wave also becomes a signal including phase noise from the oscillators 605 and 625. However, in the mixer 629 in the down-converter 621, the TV broadcast signal with phase noise is mixed with the aforementioned down-converted reference signal of 3.471 GHz so that the phase noise is cancelled. Eventually, therefore, from the bandpass filter 622 of the down-converter 621, there is reproduced a UHF band signal having a frequency which agrees with the frequency of the UHF band signal inputted into the bandpass filter 602 of the up-converter 601.

Moreover, in the down-converter 621, an input signal is divided into a signal in a frequency band of 3.941-4.241 GHz and a reference signal of 3.471 GHz by the divider 636 and the bandpass filters 623, 624, and with only the reference signal of 3.471 GHz amplified by the amplifier 634, the mixer 629 is driven in a linear region. This reduces distortion of the signal outputted from the down-converter 621, resulting in an increased communication distance.

The scheme adopted in the radio relay device in the fifth embodiment, which is particularly effective in terrestrial digital TV broadcasting using orthogonal frequency division multiplexing (OFDM), is also able to wirelessly relay satellite communication/broadcasting IF signals of a frequency of about 1 to 2 GHz.

Further, the arrangement for canceling the phase noise has been described by way of example in the fifth embodiment, although the filter-integrated even-harmonic mixer having the planar filter of the present invention can also be used as a mixer for a common heterodyne transmitter and receiver using a microwave band or a millimeter wave band.

Further, as described in connection with the fifth embodiment, use of the planar filter-integrated even-harmonic mixer having the planar filter 301 of the present invention allows reduction in component parts count of the up-converter 601 and the down-converter 621 and downsizing of the device, as well as reduction in radiation of the unnecessary wave.

Further, the arrangement of the fifth embodiment allows the planar filter-integrated even-harmonic mixers 606 and 626 and the oscillators 605 and 625 to be component parts common to the up-converter 601 and the down-converter 621. Moreover, the millimeter wave amplifiers 613 and 633 may also be component parts common to the up-converter 601 and the down-converter 621. Therefore, it becomes possible to reduce lines of millimeter-wave parts which are expensive at present. It goes without saying that independent use of the planar filter of the present invention, without use of the planar filter-integrated even-harmonic mixer, still has a large effect on downsizing of the device and reduction in radiation of the unnecessary wave.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A planar filter, comprising:

a first U-shaped open transmission line resonator;

a second U-shaped open transmission line resonator; and a crank-shaped open transmission line resonator having a middle portion and first and second end portions at opposing ends of the middle portion, the first end portion being bent at substantially a right angle with respect to the middle portion to extend in a first direction from the middle portion and the second end portion being bent at substantially a right angle with respect to the middle portion to extend in a second direction from the middle portion, opposed to the first direction.

2. The planar filter as defined in claim 1, wherein the first and second U-shaped open transmission line resonators and the crank-shaped open transmission line resonator have a line length that is half an equivalent wavelength of a passband center frequency component.

3. The planar filter as defined in claim 1, wherein the first and second U-shaped open transmission line resonators and the crank-shaped open transmission line resonator are arranged so as to be electromagnetically coupled in an order of the first U-shaped open transmission line resonator, the crank-shaped open transmission line resonator, and the second U-shaped open transmission line resonator.

4. The planar filter as defined in claim 3, further comprising:

a first input/output transmission line and a second input/output transmission line, wherein the first input/output transmission line is arranged so as to be electromagnetically coupled to the first U-shaped open transmission line resonator, and the second input/output transmission line is arranged so as to be electromagnetically coupled to the second U-shaped open transmission line resonator.

5. The planar filter as defined in claim 4, wherein the first and second input/output transmission lines and the crank-shaped open transmission line resonator are arranged such that a part of at least one of the first and second input/output transmission lines and a part of the crank-shaped open transmission line resonator are electromagnetically coupled to each other.

6. The planar filter as defined in claim 1, wherein the first and second U-shaped open transmission line resonators and the crank-shaped open transmission line resonator are formed on a semiconductor substrate.

7. A semiconductor device comprising the planar filter as defined in claim 1, wherein the planar filter is integrated with a mixer on a semiconductor substrate.

8. A radio unit comprising the planar filter as defined in claim 1.

* * * * *